US010613568B1

(12) United States Patent
Hu et al.

(10) Patent No.: US 10,613,568 B1
(45) Date of Patent: Apr. 7, 2020

(54) VOLTAGE STABILIZING METHOD AND APPARATUS FOR POWER SUPPLY DRIVING

(71) Applicant: Jiahua Hu, Zhongshan (CN)

(72) Inventors: Jiahua Hu, Zhongshan (CN); Er'wei Dong, Zhongshan (CN)

( * ) Notice: Subject to any disclaimer, the term of this patent is extended or adjusted under 35 U.S.C. 154(b) by 0 days.

(21) Appl. No.: 16/239,958

(22) Filed: Jan. 4, 2019

(51) Int. Cl.
*G05F 1/70* (2006.01)
*H02M 3/158* (2006.01)
*H03K 17/16* (2006.01)
*H03K 17/0812* (2006.01)

(52) U.S. Cl.
CPC .............. *G05F 1/70* (2013.01); *H02M 3/158* (2013.01); *H03K 17/0812* (2013.01); *H03K 17/162* (2013.01); *H03K 17/168* (2013.01)

(58) Field of Classification Search
CPC ...... G05F 1/70; H02M 3/158; H03K 17/0812; H03K 17/16; H03K 17/162; H03K 17/168
See application file for complete search history.

(56) References Cited

U.S. PATENT DOCUMENTS

| 5,363,020 A * | 11/1994 | Chen | H02M 1/4225 |
| | | | 315/209 R |
| 6,037,754 A * | 3/2000 | Harper | H02M 3/156 |
| | | | 323/222 |
| 2019/0235025 A1* | 8/2019 | Avritch | G01R 31/42 |

* cited by examiner

*Primary Examiner* — Adolf D Berhane

(57) ABSTRACT

A voltage stabilizing method for power supply driving includes: receiving an input current from a power supply, detecting whether the input current is subject to at least one of interference, undervoltage, overvoltage and short circuit, proceeding to the next step if the input current meets the requirement, otherwise outputting the current through the ground wire and repeating the detection; processing the current by zero-state response and outputting a sinusoidal drive current; detecting the type and working parameters of a connected electrical product, and adjusting a required voltage and a required current frequency according to the detection; and detecting the stability of a loop load, transferring the current to the load if it is detected that the stability of the loop load meets the requirement, and going back to step S1 if it is detected that the stability of the loop load does not meet a preset standard.

9 Claims, 3 Drawing Sheets

VOLTAGE STABILIZING METHOD AND APPARATUS FOR POWER SUPPLY DRIVING

TECHNICAL FIELD

The present disclosure relates to the field of voltage stabilizing power supply, and in particular, to a voltage stabilizing method and apparatus for power supply driving.

BACKGROUND

Currently there are many types of switch regulated power supply products and the difference between their performances is great. Normal operation mostly is in the band from 60 to 500 KHz. As it is well known, improving the switch frequency may more efficiently exhibit the advantages and more efficiently suppress the ripples. But the same difficult problem which they suffer from is the speed limit from the switch. It is difficult to work in the band of 500 KHz and improve the frequency of the switch regulated power supply, even if the base region is made much thinner to reduce the electron loss.

It is known to use a Field Effect Transistor (FET) as a switch. Such switch can work in the band from 300 KHz to 3 MHz. But if the power supply needs to work in the band of 5 MHz to more efficiently suppress the ripple and to reduce the volume and weight, the switch should be selected more carefully, therefore improving the cost, or the chip is controlled to resolve its response. Although the switch regulated power supply device developed by the conditions above may improve the frequency of the switch regulated power supply, reduce the volume and the weight, increase the power and effectively reduce ripples, and so on, however, this method mostly employs series resonance circuit and parallel resonance circuit, or employs pulse output electrical wire inductance as coupling member, resulting in that the load loop of the switch become into the resonance loop. The current waveform in the form of resonance makes that the load current have very great changes with the input voltage.

Therefore, there is a need for a voltage stabilizing method and apparatus which can make the design simple and light, have low production cost and good load current waveform, simplify wire manufactures of inductance type in a production process, and enable reduction of the power consumption and interference of materials used in the past as well as efficiency decrease caused by heating of the materials.

SUMMARY

With respect to the shortcomings in the prior art, disclosed herein are voltage stabilizing method and apparatus for power supply driving, which enable an output current not to be affected by changes in an input voltage and a load current on the premise of maintaining resonant current wave oscillating drive, so as to stabilize the voltage output.

According to one aspect of the disclosure, there is provided a voltage stabilizing method for power supply driving, comprising the following steps:

S1. receiving an input current from a power supply, detecting whether the input current is subject to at least one of interference, undervoltage, overvoltage and short circuit, proceeding to the next step if the input current meets the requirement, and otherwise, outputting the current through the ground wire and repeating the detection;

S2. processing the current by zero-state response, and outputting a sinusoidal drive current;

S3. detecting the type and working parameters of a connected electrical product, and adjusting a required voltage and a required current frequency according to the detection; and S4. detecting the stability of a loop load, transferring the current to the load if it is detected that the stability of the loop load meets the requirement, and going back to step S1 if it is detected that the stability of the loop load does not meet a preset standard.

In some embodiments, step S2 further comprises processing the sinusoidal drive current by filtering third order harmonic wave in the current while retaining a fundamental wave therein.

According to another aspect of the disclosure, there is further provided a voltage stabilizing apparatus for power supply driving, comprising:

a current input unit, a current output unit, a first detecting unit configured to detect whether an input current is subject to at least one of interference, undervoltage, overvoltage and short circuit, proceeding to the next step if the input current meets the requirement, and otherwise, outputting the current through the ground wire and repeating the detection, a current adjusting unit configured to process the current by zero-state response, and output a sinusoidal drive current, and a second detecting unit configured to detect the type and working parameters of a connected electrical product, and adjust a required voltage and a required current frequency according to the detection.

In some embodiments, the current input unit comprises at least two voltage stabilizing control fibers.

In some embodiments, the first detecting unit comprises at least one first integrated circuit and a pulse width controller.

In some embodiments, the second detecting unit comprises at least one second integrated circuit and a pulse width controller.

In some embodiments, the apparatus further comprises at least one filter unit connected to the current adjusting unit and configured to process the sinusoidal drive current by filtering third order harmonic wave in the current while retaining a fundamental wave therein.

In some embodiments, the first detecting unit and the second detecting unit are both connected to the ground wire.

In some embodiments, the apparatus is encapsulated to have 16 pins applied to power driven products, and in addition to being encapsulated to have 16 pins, the voltage stabilizing apparatus for power supply driving can also be encapsulated to have 24 pins, including AC to DC, AC to AC, and DC to AC functions.

The present disclosure has the following beneficial effects: the present disclosure outputs a current with good waveform for a load end, reduces the power consumption and interference of materials as well as efficiency decrease caused by heating of the materials, and is suitable for all kinds of industrial, commercial and household electrical appliances, particularly suitable for computers, audio devices, lamps, air conditioners, motors, lifts, escalators, electric water heaters, electric sockets, and other products.

The foregoing summary does not define the limits of the appended claims. Other aspects, embodiments, features, and advantages will be or will become apparent to one with skill in the art upon examination of the following figures and detailed description. It is intended that all such additional features, aspects, and advantages be included within this description and be protected by the accompanying claims.

BRIEF DESCRIPTION OF DRAWINGS

The accompanying drawings described herein are for illustration only and are not intended to limit the scope of the disclosure in any way. The components in the drawings are not necessarily drawn to scale, and the emphasis instead being placed on illustrating the principle of the present disclosure. In addition, in the drawings, like reference numbers indicate corresponding components throughout the drawings, in which.

DETAILED DESCRIPTION

The following detailed description, which references to and incorporates the drawings, describes and illustrates one or more examples of systems and methods of voltage stabilization of power supplies. These examples, offered not to limit but only to exemplify and teach embodiments of the invention(s), are shown and described in sufficient detail to enable those skilled in the art to practice what is claimed. Thus, where appropriate to avoid obscuring the invention, the description may omit certain information known to those of skill in the art. The descriptions herein provide examples that should not be read to unduly limit the scope of any patent claims that may eventual be granted based on this application.

The word "exemplary" is used throughout this application to mean "serving as an example, instance, or illustration." Any system, method, device, technique, feature or the like described herein as "exemplary" is not necessarily to be construed as preferred or advantageous over other features.

As used in this specification and the appended claims, the singular forms "a," "an," and "the" include plural referents unless the content clearly dictates otherwise.

Although any components, methods, devices, and systems similar or equivalent to those described herein can be used in the practice of the invention(s), specific examples of appropriate components, methods, devices and systems are described herein.

Also, the use of "or" means "and/or" unless stated otherwise. Similarly, "comprise," "comprises," "comprising" "include," "includes," and "including" are interchangeable and not intended to be limiting.

The present disclosure will be explained hereinafter in more detail with reference to the accompanying drawings.

Figure 1:
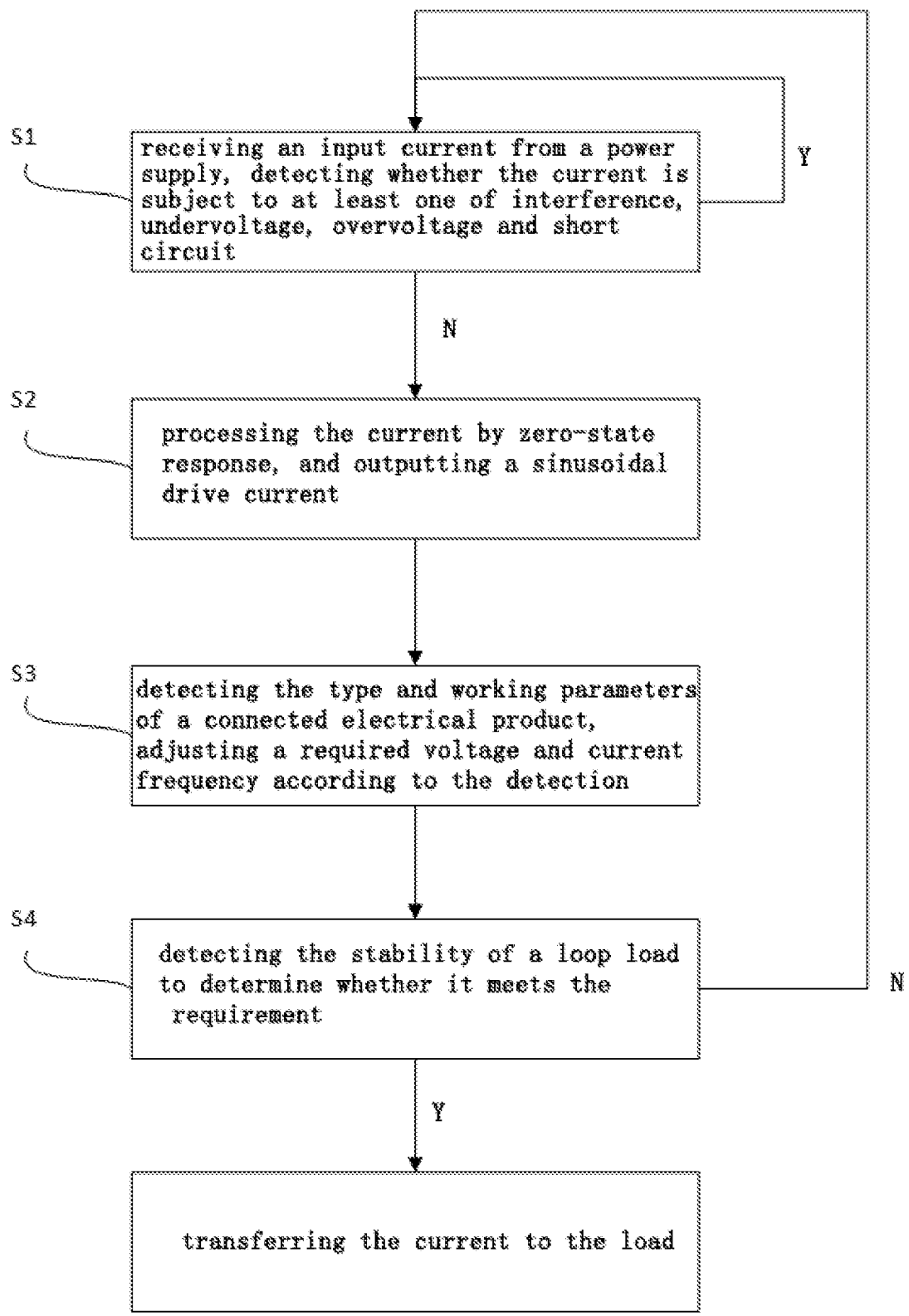
FIG. 1 is a flowchart of a voltage stabilizing method for power supply driving according to the present disclosure.

Referring to FIG. 1, which shows a flowchart of an exemplary voltage stabilizing method for power supply driving. The method comprises: receiving an input current from a power supply, and detecting whether the input current is subject to interference, undervoltage, overvoltage and short circuit, wherein the method proceeds to the next step if the input current meets the requirement, otherwise outputting the current output through the ground wire and repeating the detection; processing the current by zero-state response and outputting a sinusoidal drive current; detecting the type and working parameters of a connected electrical product, and adjusting a required voltage and a required current frequency according to the detection; detecting the stability of a loop load, wherein the current is transferred to the load if it is detected that the stability of the loop load meets the requirements, or the process goes back to step S1 if it is detected that the stability of the loop load does not meet a preset standard.

In the above embodiment, before the sinusoidal drive current is transferred to a receiving-end device (e.g., a computer, an audio device, a motor, etc.), the sinusoidal drive current may be filtered, with a fundamental wave therein maintained and third order harmonic wave in the current filtered.

In the above embodiment, voltages and current frequencies required by different receiving-end devices are properly adjusted to avoid extra output, overheating of the circuit and waste of electric energy. For example, when the receiving-end device is an audio device, the audio device requires a current with high level and low current frequency, so that no sound distortion occurs when the audio device plays. Therefore, after the input current from the power supply is received and zero-time responsively started, the current output is properly adjusted to a high level and a low current frequency.

Figure 2:
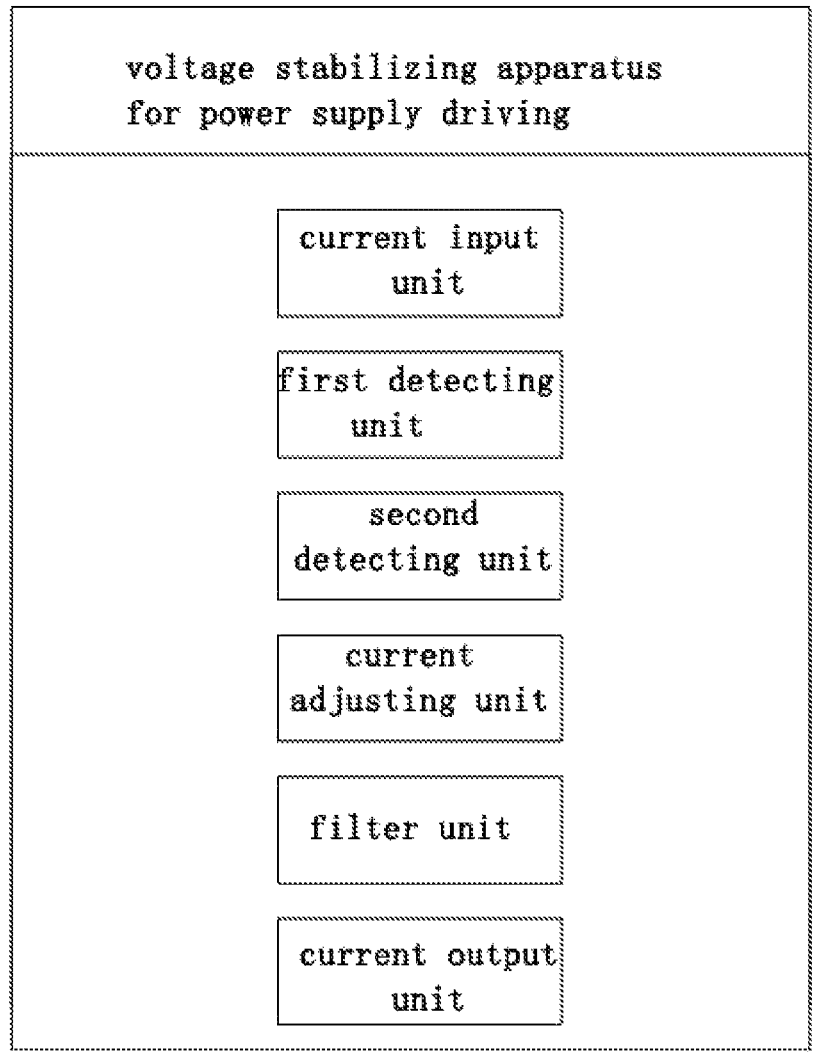
FIG. 2 is a schematic diagram of an embodiment of a voltage stabilizing apparatus for power supply driving according to the present disclosure.

Referring to FIG. 2, the present disclosure further provides a voltage stabilizing apparatus for power supply driving, including: a current input unit; a current output unit; a first detecting unit configured to detect whether the input current is subject to interference, undervoltage, overvoltage and short circuit, and proceed to the next step if the input current meets the requirements, otherwise output the current output through the ground wire and repeat the detection; a second detecting unit configured to detect the type and working parameters of a connected electrical product, and adjust a required voltage and a required current frequency according to the detection and a current adjusting unit configured to process the current by zero-state response and output a sinusoidal drive current.

Further, in the above embodiment, the current input unit includes at least two voltage stabilizing control fibers. The first detecting unit includes at least one first integrated circuit and a pulse width controller. The second detecting unit includes at least one second integrated circuit and a pulse width controller. In addition, the first detecting unit and the second detecting unit are both connected to the ground wire.

Further, in the above embodiment, the voltage stabilizing apparatus for power supply driving further includes a filter unit which is connected to the current adjusting unit, and is configured to filter the sinusoidal drive current so as to filter third order harmonic wave in the current while retaining a fundamental wave therein.

Figure 3:
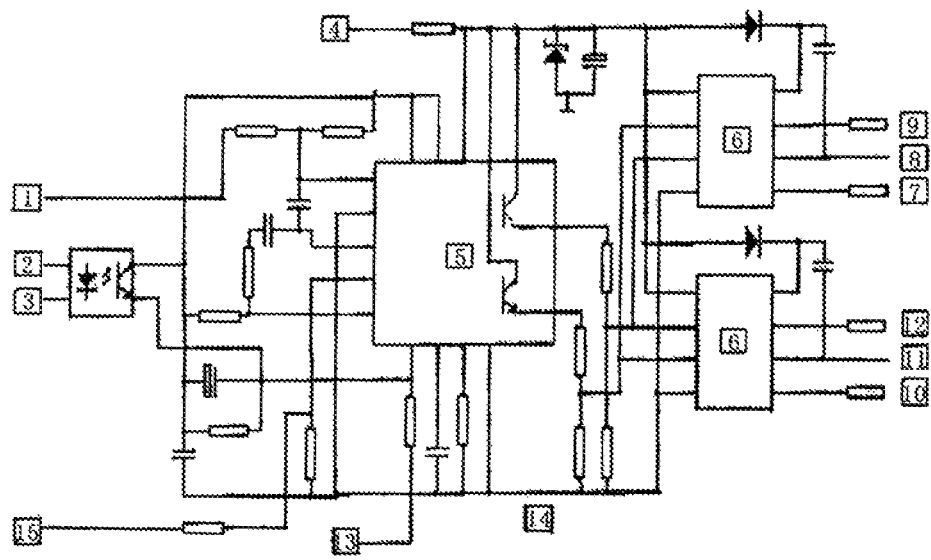
FIG. 3 is a schematic circuit diagram of another embodiment of a voltage stabilizing apparatus for power supply driving according to the present disclosure.

Referring to FIG. 3 which shows a circuit diagram of another embodiment of a voltage stabilizing apparatus according to the present disclosure. Specifically, the voltage stabilizing apparatus for power supply driving includes a current input controller 1, voltage stabilizing control fibers 2 and 3, a working voltage input 4, a first integrated circuit 5, a second integrated circuit 6, a bottom right drive output 7, a top right drive midpoint 8, a top right drive output 9, a bottom left drive output 10, a top left drive midpoint 11, a top left drive output 12, a pulse width modulator 13, a ground wire 14, and a current output controller 15.

Further, in the above embodiment, the first integrated circuit 5 uses a TL494 integrated circuit, and the second integrated circuit 6 uses an integrated circuit with the model of 21.

Figure 4:
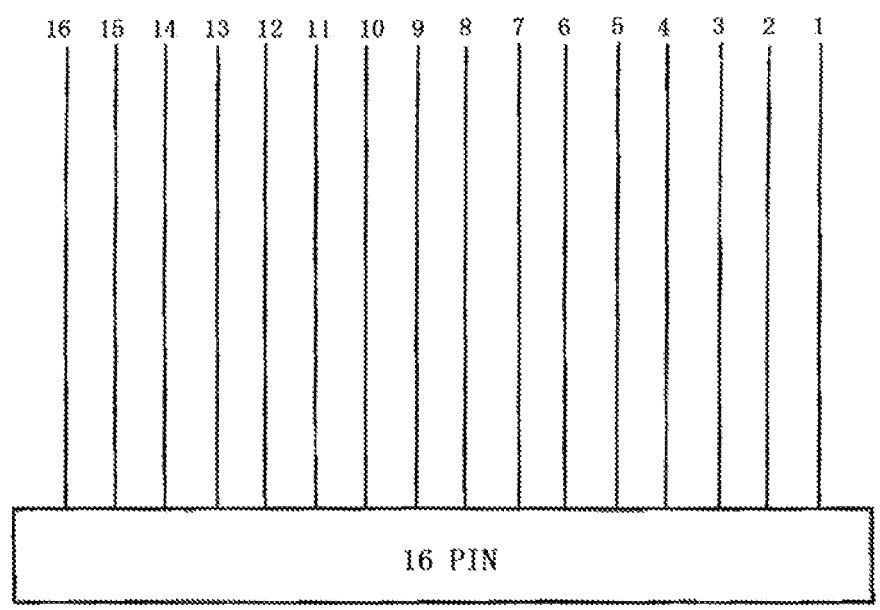
FIG. 4 is a schematic diagram of function allocation of 16 pins of the voltage stabilizing apparatus for power supply driving according to the present disclosure.

Referring to FIG. 4 which shows a schematic diagram of function allocation of 16 pins of the voltage stabilizing apparatus according to the present disclosure. In some embodiments, the voltage stabilizing apparatus of the present disclosure can be encapsulated to have 16 pins, including a current input controller 1, voltage stabilizing control fibers 2 and 3, a working voltage input 4, a first integrated circuit 5, a second integrated circuit 6, a bottom right drive output 7, a top right drive midpoint 8, a top right drive output 9, a bottom left drive output 10, a top left drive midpoint 11, a top left drive output 12, a pulse width modulator 13, a ground wire 14, a current output controller 15 and an empty pin 16. In addition to being encapsulated as 16 pins, in some embodiments, the apparatus can also be encapsulated to have 12 pins or 24 pins with AC to DC, AC to AC, and DC to AC functions, which is suitable for commercial and household electrical appliances, particularly suitable for computers, audio devices, air conditioners, lifts, escalators and other devices.

It should be understood that although terms such as first, second, and third may be used to describe various kinds of information in the disclosure, these kinds of information should not be limited to the terms. These terms are merely used to distinguish information of the same type from each other. For example, without departing from the scope of the disclosure, the first information may also be referred to as second information, and similarly, the second information may also be referred to as first information. Depending on the context, the word "if" used herein may be explained as "when . . . ," "as . . . ," or "in response to the determination."

It should be understood that, depending on the example, certain acts or events of any of the methods described herein can be performed in a different sequence, may be added, merged, or left out altogether (e.g., not all described acts or events are necessary for the practice of the method). Moreover, in certain examples, acts or events may be performed concurrently, e.g., through multi-threaded processing, interrupt processing, or multiple processors, rather than sequentially. In addition, while certain aspects of this disclosure are described as being performed by a single module or component for purposes of clarity, it should be understood that the techniques of this disclosure may be performed by any suitable combination of components or modules.

After considering the specification and practicing the disclosure herein, other embodiments of the apparatuses and methods disclosed herein may become obvious to those skilled in the art. The disclosure is intended to cover any variation, use or adaptive changes of these techniques, which follow the general principles disclosed herein and include common knowledge or common technical means in the technical field that are not disclosed by the disclosure. The specification and the embodiments are to be regarded as exemplary only and the true scope of the disclosure is indicated by the claims.

The foregoing description is illustrative and not restrictive. Although certain exemplary embodiments have been described, other embodiments, combinations and modifications involving the invention will occur readily to those of ordinary skill in the art in view of the foregoing teachings. Therefore, this invention is to be limited only by the following claims, which cover the disclosed embodiments, as well as all other such embodiments and modifications when viewed in conjunction with the above specification and accompanying drawings.

What is claimed is:

1. A voltage stabilizing method for power supply driving, comprising the following steps:
   S1. receiving an input current from a power supply, detecting whether the input current is subject to at least one of interference, undervoltage, overvoltage and short circuit, proceeding to the next step if the input current meets the requirement, and otherwise, outputting the current through the ground wire and repeating the detection;
   S2. processing the current by zero-state response, and outputting a sinusoidal drive current;
   S3. detecting the type and working parameters of a connected electrical product, and adjusting a required voltage and a required current frequency according to the detection; and
   S4. detecting the stability of a loop load, transferring the current to the load if it is detected that the stability of the loop load meets the requirement, and going back to step S1 if it is detected that the stability of the loop load does not meet a preset standard.

2. The voltage stabilizing method for power supply driving according to claim 1, wherein step S2 further comprises processing the sinusoidal drive current by filtering third order harmonic wave in the current while retaining a fundamental wave therein.

3. A voltage stabilizing apparatus for power supply driving, comprising:
   a current input unit,
   a current output unit,
   a first detecting unit configured to detect whether an input current is subject to at least one of interference, undervoltage, overvoltage and short circuit, proceeding to the next step if the input current meets the requirement, and otherwise, outputting the current through the ground wire and repeating the detection,
   a current adjusting unit configured to process the current by zero-state response, and output a sinusoidal drive current, and
   a second detecting unit configured to detect the type and working parameters of a connected electrical product, and adjust a required voltage and a required current frequency according to the detection.

4. The voltage stabilizing apparatus for power supply driving according to claim 3, wherein the current input unit comprises at least two voltage stabilizing control fibers.

5. The voltage stabilizing apparatus for power supply driving according to claim 4, wherein the first detecting unit comprises at least one first integrated circuit and a pulse width controller.

6. The voltage stabilizing apparatus for power supply driving according to claim 4, wherein the second detecting unit comprises at least one second integrated circuit and a pulse width controller.

7. The voltage stabilizing apparatus for power supply driving according to claim 4, wherein the first detecting unit and the second detecting unit are both connected to the ground wire.

8. The voltage stabilizing apparatus for power supply driving according to claim 4, further comprising at least one filter unit connected to the current adjusting unit and configured to process the sinusoidal drive current by filtering third order harmonic wave in the current while retaining a fundamental wave therein.

9. The voltage stabilizing apparatus for power supply driving according to claim 4, wherein the apparatus is encapsulated to have 16 pins or 24 pins.

* * * * *